(12) United States Patent
Yamakawa et al.

(10) Patent No.: US 8,884,512 B2
(45) Date of Patent: Nov. 11, 2014

(54) WHITE LIGHT EMITTING LAMP AND WHITE LED LIGHTING APPARATUS INCLUDING THE SAME

(75) Inventors: Masahiko Yamakawa, Yokohama (JP); Yasuhiro Shirakawa, Yokohama (JP); Hajime Takeuchi, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 211 days.

(21) Appl. No.: 13/496,662

(22) PCT Filed: Aug. 25, 2010

(86) PCT No.: PCT/JP2010/064382
§ 371 (c)(1),
(2), (4) Date: Mar. 16, 2012

(87) PCT Pub. No.: WO2011/033910
PCT Pub. Date: Mar. 24, 2011

(65) Prior Publication Data
US 2012/0187824 A1    Jul. 26, 2012

(30) Foreign Application Priority Data
Sep. 17, 2009  (JP) .................................. 2009-215889

(51) Int. Cl.
*H01L 33/50* (2010.01)
*C09K 11/66* (2006.01)
*C09K 11/77* (2006.01)

(52) U.S. Cl.
CPC ........... *C09K 11/7739* (2013.01); *C09K 11/665* (2013.01); *C09K 11/7789* (2013.01); *H01L 33/502* (2013.01); *Y02B 20/181* (2013.01); *H01L 33/504* (2013.01); *C09K 11/7734* (2013.01)
USPC .................................. 313/503; 252/301.4 R

(58) Field of Classification Search
CPC ........... C09K 11/0844; C09K 11/0866; H01L 33/502; H01L 33/504
USPC ............ 313/486–487, 501–503; 257/99–100, 257/98; 252/301.4 R
See application file for complete search history.

(56) References Cited

U.S. PATENT DOCUMENTS

| | | | |
|---|---|---|---|
| 7,026,755 B2 * | 4/2006 | Setlur et al. | 313/501 |
| 2005/0001532 A1 * | 1/2005 | Srivastava et al. | 313/484 |

(Continued)

FOREIGN PATENT DOCUMENTS

| | | |
|---|---|---|
| JP | 8-55610 | 2/1996 |
| JP | 2005 340748 | 12/2005 |

(Continued)

*Primary Examiner* — Karabi Guharay
(74) *Attorney, Agent, or Firm* — Oblon, Spivak, McClelland, Maier & Neustadt, L.L.P.

(57) ABSTRACT

An object is to provide a white light emitting lamp in which a BGR phosphor containing blue, green and red phosphor is combined with a semiconductor light emitting element such as an LED, a deep red phosphor having a main emission peak in a longer wavelength region than a main emission peak of the red phosphor is further added so as to enhance characteristics, whereby both high luminance and high color rendering properties can be obtained. This invention provides a white light emitting lamp 1 comprising: a semiconductor light emitting element 2 that is placed on a board 3 and emits ultraviolet light or blue light; and a light emitting portion that is formed so as to cover a light emitting surface of the semiconductor light emitting element 2, the light emitting portion containing a blue phosphor B, a green phosphor G, and a red phosphor R that are excited by the light emitted from the semiconductor light emitting element 2 to respectively emit blue light, green light, and red light, the white light emitting lamp 1 emitting white light by mixing light emission colors from the blue phosphor B, the green phosphor G, and the red phosphor R with one another, wherein the light emitting portion further contains a deep red phosphor DR having a main emission peak in a longer wavelength region than a main emission peak of the red phosphor.

20 Claims, 3 Drawing Sheets

(56) References Cited

U.S. PATENT DOCUMENTS

| | | | |
|---|---|---|---|
| 2005/0029927 A1 | 2/2005 | Setlur et al. | |
| 2005/0156496 A1 | 7/2005 | Takashima et al. | |
| 2007/0241657 A1* | 10/2007 | Radkov et al. | 313/483 |
| 2007/0276606 A1* | 11/2007 | Radkov et al. | 702/19 |
| 2008/0199728 A1 | 8/2008 | Kim et al. | |

FOREIGN PATENT DOCUMENTS

| | | |
|---|---|---|
| JP | 2008 174621 | 7/2008 |
| JP | 2008 202044 | 9/2008 |
| JP | 2009 030063 | 2/2009 |
| JP | 2009 081288 | 4/2009 |
| WO | WO 2006/118104 A1 | 11/2006 |

* cited by examiner

WHITE LIGHT EMITTING LAMP AND WHITE LED LIGHTING APPARATUS INCLUDING THE SAME

TECHNICAL FIELD

The present invention relates to a white light emitting lamp including a semiconductor light emitting element and a white LED lighting apparatus (white LED illumination apparatus) including the white light emitting lamp, and more particularly, to a white light emitting lamp having improved color rendering properties and light emission efficiency and a white LED lighting apparatus including the white light emitting lamp.

BACKGROUND ART

Light emitting diodes (LEDs) are semiconductor light emitting elements that convert electrical energy into ultraviolet light and visible light thereby to emit the converted light. Such light emitting diodes have a long service life and high reliability, and thus require less frequent replacement when being used as a light source, which is advantageous. LED lamps including an LED chip sealed with a transparent resin or the like are widely applied to: backlights of liquid crystal displays used in, for example, display portions of portable communication equipment, PC peripheral equipment, office automation (OA) equipment, and home electrical equipment; and lighting apparatuses such as signaling equipment, various switches, in-vehicle lamps, and general lighting.

With regard to the color tone of light emitted from the LED lamps, the LED chip is combined with various phosphors having different light emission colors, whereby light from blue color to red color in a visible light region can be achieved in accordance with one's intended use. In particular, LED lamps that emit white light (white LED lamps) are rapidly becoming widespread to be applied to backlights of liquid crystal displays, in-vehicle lamps, and the like, and are expected to significantly expand as an alternative to fluorescent lamps in the future. For example, general fluorescent lamps are made using mercury, and hence the white LED lamps made without using mercury are considered to replace the fluorescent lamps in the future.

Known examples of the white LED lamp that has become widespread or is experimentally used at present may include: an LED lamp including a blue LED in combination with a green phosphor (such as YAG); and an LED lamp including an ultraviolet LED having an emission wavelength of 360 to 440 nm in combination with a mixture of blue (B), green (G), and red (R) phosphors (BGR phosphors). Owing to superior luminance characteristics of the former, the former is currently more widespread than the latter. The light distribution of the former white LED lamp is, however, biased toward blue components and green components, and light containing red components is lacking and insufficient. Hence, in the case of even an LED lamp having emission chromaticity sufficient as a light source, the color of reflected light when an object is observed using this light source is significantly different from a natural color observed under sunlight. That is, there is posed a problem such that the color rendering properties of the former are low.

In contrast to the former, the latter white LED lamp including the ultraviolet LED, which unfortunately has luminance inferior to that of the former, has smaller color unevenness in emitted light and projected light, and thus is expected to become a mainstream white lamp in the future. As to the white LED lamp including the ultraviolet LED, lamp characteristics such as luminance (brightness) and color rendering properties are increasingly improved by adjusting characteristics of phosphors and a combination of the phosphors (see Patent Documents 1 and 2). For example, in order to enhance the brightness of the white LED lamp, it is studied to use a green phosphor having an emission peak wavelength of 540 to 570 nm in place of a green phosphor having an emission peak wavelength of 500 to 530 nm.

The white LED lamp to which such a mixture phosphor (BYR phosphor) containing the green phosphor in place of the green phosphor is applied has higher brightness than that of the white LED lamp containing the BGR phosphor, and thus is expected as a light source for a lighting apparatus. With regard to such a conventional white LED lamp to which the BYR phosphor containing the green phosphor is applied, however, a sufficient improvement effect of characteristics thereof cannot necessarily be obtained, and hence further enhancement in luminance and color rendering properties is required for the white LED lamp. Meanwhile, various green phosphors that can be used in combination with a blue LED have been proposed.

Known examples of the green phosphor that can be used in combination with the blue LED include: a cerium-activated yttrium aluminate phosphor (YAG), a cerium-activated terbium aluminate phosphor (TAG), and a europium-activated alkaline-earth silicate phosphor (BOSS) (see Patent Document 3). With regard to conventional green phosphors, light emission characteristics of the green phosphors when being excited by blue light (emission wavelength: 430 to 500 nm) emitted from a blue LED have been studied. On the other hand, light emission characteristics of the green phosphors when being excited by light (emission wavelength: of 360 to 440 nm) emitted from an ultraviolet LED have not been sufficiently studied, and thus are required to be studied and improved.

In addition, in order to enhance the color rendering properties of white light, a white LED apparatus including a blue LED and an ultraviolet LED in combination with a green phosphor and a red phosphor has also been proposed (see Patent Document 4). The color rendering properties of this white LED apparatus have been improved to some extent, but because part of blue light is easily absorbed by the phosphors, the luminance from a light emitting portion easily decreases.

CITATION LIST

Patent Document

Patent Document 1: Japanese Patent Laid-Open No. 2002-171000
Patent Document 2: Japanese Patent Laid-Open No. 2003-160785
Patent Document 3: Japanese Patent No. 3749243
Patent Document 4: US 2006/0249739 A1

SUMMARY OF INVENTION

Problems to be Solved by the Invention

The present invention has an object to provide a white light emitting lamp in which: in the case of combination use of a BGR phosphor containing a blue phosphor, a green phosphor, and a red phosphor with a semiconductor light emitting element such as an LED, a deep red phosphor having a main emission peak in a longer wavelength region than a main emission peak of the red phosphor is further added; and both the red phosphor and the deep red phosphor are used together, whereby both high luminance and high color rendering properties can be obtained. The present invention has another object to provide a white LED lighting apparatus including such a white light emitting lamp as described above.

Means for Solving the Problems

A white light emitting lamp according to one aspect of the present invention comprises: a semiconductor light emitting element that is placed on a board (insulating substrate) and emits ultraviolet light or blue light; and a light emitting portion that is formed so as to cover a light emitting surface of the semiconductor light emitting element, the light emitting portion containing a blue phosphor, a green phosphor, and a red phosphor that are excited by the light emitted from the semiconductor light emitting element to respectively emit blue light, green light, and red light. The white light emitting lamp emits white light by mixing light emission colors from the blue phosphor, the green phosphor, and the red phosphor with one another, wherein the light emitting portion further contains a deep red phosphor having a main emission peak in a longer wavelength region than a main emission peak of the red phosphor.

Specifically, the white light emitting lamp comprises: the semiconductor light emitting element that emits light having a peak wavelength in a range of 370 nm or more and 470 nm or less; and the light emitting portion that is excited by the light emitted from the semiconductor light emitting element to emit the white light. The light emitting portion contains: the blue phosphor that absorbs the light to emit light having a peak wavelength in a range of 440 nm or more and 470 nm or less; the green phosphor that absorbs the light to emit light having a peak wavelength in a range of 530 nm or more and 600 nm or less; the red phosphor that absorbs the light to emit light having a peak wavelength in a range of 610 nm or more and 630 nm or less; and the deep red phosphor that absorbs the light to emit light having a peak wavelength in a range of 640 nm or more and 660 nm or less.

Note that it is important to select such phosphors that enable the main emission peak of the red phosphor and the main emission peak of the deep red phosphor to appear separately from each other in a spectral graph, in order to improve light emission intensity and color rendering properties. An advantage of the present invention is less likely to be obtained using a phosphor having a wide light emission range that overlaps with a light emission range of the red phosphor that emits the light having the peak wavelength in the range of 610 nm or more and 630 nm or less and with a light emission range of the deep red phosphor that emits the light having the peak wavelength in the range of 640 nm or more and 660 nm or less.

Further, in the above-mentioned white light emitting lamp, it is preferable that the blue phosphor, the green phosphor, the red phosphor, and the deep red phosphor each have an average particle diameter in a range of 10 μm or more and 80 μm or less.

Further, in the above-mentioned white light emitting lamp, it is preferable that the light emitting portion include a transparent resin layer that is formed so as to cover the light emitting surface of the semiconductor light emitting element and contains the blue phosphor, the green phosphor, the red phosphor, and the deep red phosphor.

Further, in the above-mentioned white light emitting lamp, it is preferable that the light emitting portion include: a first transparent resin layer that is formed so as to cover the light emitting surface of the semiconductor light emitting element and does not contain the blue phosphor, the green phosphor, the red phosphor, and the deep red phosphor; and a second transparent resin layer that is formed so as to cover the first transparent resin layer and contains the blue phosphor, the green phosphor, the red phosphor, and the deep red phosphor.

Further, in the above-mentioned white light emitting lamp, it is preferable that the semiconductor light emitting element be a light emitting diode or a laser diode that emits light having a peak wavelength in a range of 370 nm or more and 470 nm or less.

A white LED lighting apparatus according to the present invention comprises the above-mentioned white light emitting lamp according to the present invention.

Advantageous Effects of the Invention

In a white light emitting lamp according to the present invention, a deep red phosphor having a main emission peak in a longer wavelength region than a main emission peak of a red phosphor is further added, and both the red phosphor and the deep red phosphor are used together. Hence, luminance characteristics (light emission efficiency) and color rendering properties can be both enhanced. Such a white light emitting lamp having both the high color rendering properties and the high luminance can be suitably used for lighting (illumination) and other such purposes.

BEST MODE FOR CARRYING OUT THE INVENTION

Figure 1:
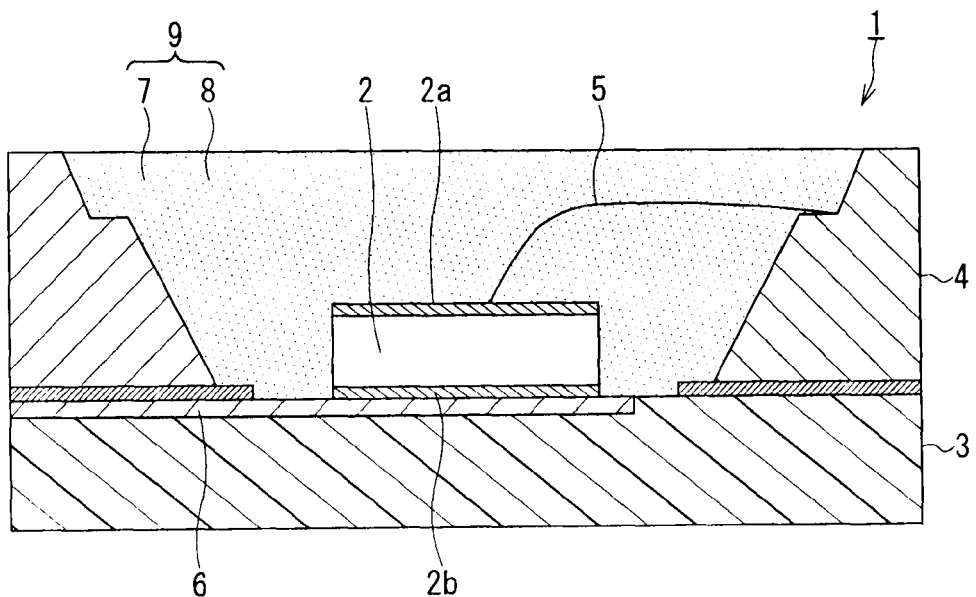
FIG. 1 is a cross-sectional view illustrating a configuration of a white light emitting lamp according to an embodiment of the present invention.

Hereinafter, a mode for carrying out the present invention is described with reference to the drawings. FIG. 1 is a cross-sectional view illustrating a configuration of an embodiment in which a white light emitting lamp of the present invention is applied to a white LED lamp. A white LED lamp 1 illustrated in FIG. 1 includes an LED chip 2 as an excitation source (light source). The excitation source is not limited to the LED chip 2. A semiconductor light emitting element such as a light emitting diode and a laser diode having an emission peak wavelength in a range of 370 nm or more and 470 nm or less is used as the excitation source of the white light emitting lamp.

Various light emitting diodes such as InGaN-based, GaN-based, and AlGaN-based diodes are used as the LED chip 2 as the excitation source. It is preferable that an emission peak wavelength of the LED chip 2 fall within a range of 370 nm or more and 430 nm or less. The LED chip 2 as described above is used together with a BGR-DR phosphor obtained by combining a BGR phosphor with a deep red (DR) phosphor, whereby the white LED lamp 1 having high luminance and excellent color reproducibility can be achieved. Herein, the light emitting diode as the excitation source is expressed as the LED chip 2, and the light emitting lamp for finally obtaining white light emission is expressed as the white LED lamp 1.

The LED chip 2 is mounted on a wiring board 3. A cylindrical frame body 4 is provided on the wiring board 3, and an inner wall surface of the frame body 4 is formed as a reflective layer. At least a surface of the frame body 4 is made of an electrically conductive material such as metal, and constitutes part of electrical wiring for the LED chip 2. An upper electrode 2a of the LED chip 2 is electrically connected to the frame body 4 by a bonding wire 5. A lower electrode 2b of the LED chip 2 is electrically and mechanically connected to a metal wiring layer 6 of the wiring board 3. A transparent resin 7 fills a space defined by the frame body 4, and the LED chip 2 is embedded in the transparent resin layer 7.

The transparent resin layer 7 in which the LED chip 2 is embedded contains phosphors 8 for obtaining white light. The phosphors 8 dispersed in the transparent resin layer 7 are excited by light emitted from the LED chip 2, to thereby emit the white light. That is, the transparent resin layer 7 in which the phosphor 8 is dispersed functions as a light emitting portion 9 that emits the white light. The light emitting portion 9 is placed so as to cover a light emitting surface of the LED chip 2. The transparent resin layer 7 is made of, for example, a silicone resin or an epoxy resin. Note that configurations of the board 3, the frame body 4, and the like are designed appropriately.

Figure 2:
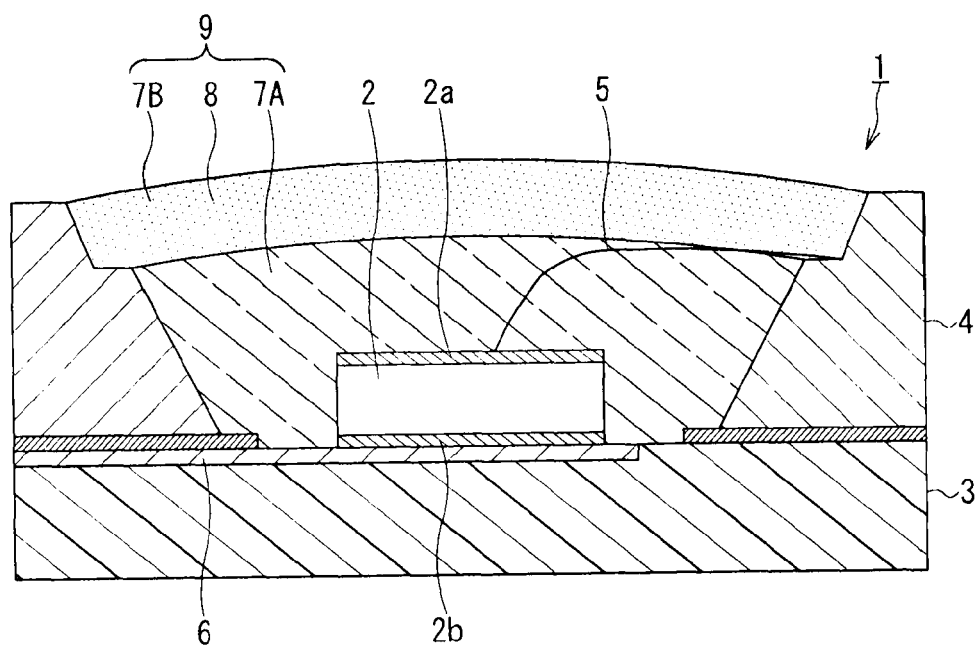
FIG. 2 is a cross-sectional view illustrating a modified example of the white light emitting lamp illustrated in FIG. 1.

As illustrated in FIG. 2, the light emitting portion 9 may include a first transparent resin layer 7A not containing the phosphor 8 and a second transparent resin layer 7B containing the phosphor 8. The first transparent resin layer 7A is placed so as to cover the light emitting surface of the LED chip 2, and the second transparent resin layer 7B is placed so as to cover the first transparent resin layer 7A. The light emitting portion 9 having the configuration as described above contributes to enhancement in the light emission efficiency of the white LED lamp 1. The first transparent resin layer 7A is placed in a range of, for example, 500 to 2,000 μm from the light emitting surface of the LED chip 2.

The phosphor 8 for obtaining the white light contains a blue (B) phosphor, a green (G) phosphor, a red (R) phosphor, and a deep red (DR) phosphor that each absorb the light emitted from the LED chip 2 (for example, ultraviolet light or violet light). The blue (B) phosphor emits light having a peak wavelength in a range of 440 nm or more and 470 nm or less, the green (G) phosphor emits light having a peak wavelength in a range of 535 nm or more and 570 nm or less, the red (R) phosphor emits light having a peak wavelength in a range of 590 nm or more and 630 nm or less, and the deep red (DR) phosphor emits light having a peak wavelength in a range of 640 nm or more and 660 nm or less. The phosphor 8 is a mixture phosphor (BGR-DR phosphor) of the BGR phosphor and the deep red (DR) phosphor. Note that the BGR-DR phosphor 8 may contain two or more types of phosphors of the same color, and may supplementarily contain a yellow phosphor or the like having a light emission color other than blue, green, red, and deep red. It is preferable to bind in advance the B, G, R, and DR phosphors of the BGR-DR phosphor 8 together using a binder and disperse the BGR-DR phosphor 8 in the binding state into the transparent resin layer 7.

Electrical energy applied to the white LED lamp 1 is converted by the LED chip 2 into the ultraviolet light or the violet light. The light emitted from the LED chip 2 is converted by the BGR-DR phosphor 8 dispersed in the transparent resin layer 7 into light having a longer wavelength. Light emission colors from the blue phosphor, the green phosphor, the red phosphor, and the deep red phosphor contained in the BGR-DR phosphor 8 are mixed with one another, and the resultant light is emitted as the white light as a whole from the white LED lamp 1. In the case where the peak wavelengths of the phosphors constituting the BGR-DR phosphor 8 respectively fall within the above-mentioned ranges, the white light having excellent luminance and color rendering properties can be obtained.

The blue phosphor of the phosphors constituting the BGR-DR phosphor 8 is made of a europium-activated alkaline-earth chlorophosphate phosphor having a composition expressed by General Formula:

$$(Sr_{1-x-y-z},Ba_x,Ca_y,Eu_z)_5(PO_4)_3Cl \quad (1)$$

(where x, y, and z are numbers that respectively satisfy $0 \leq x < 0.5$, $0 \leq y < 0.1$, and $0.005 \leq z < 0.1$).

The europium-activated alkaline-earth chlorophosphate phosphor having the composition expressed by Formula (1) is excellent in, particularly, the absorption efficiency of ultraviolet light or violet light having a peak wavelength in a range of 370 to 430 nm.

The green phosphor of the phosphors constituting the BGR-DR phosphor 8 is made of at least one of:

a europium and manganese-activated aluminate phosphor having a composition expressed by General Formula:

$$(Ba_{1-x-y-z},Sr_x,Ca_y,Eu_z)(Mg_{1-u}Mn_u)Al_{10}O_{17} \quad (2)$$

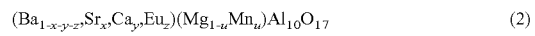

(where x, y, z, and u are numbers that respectively satisfy $0 \leq y < 0.2$, $0 \leq y < 0.1$, $0.005 < z < 0.5$, and $0.1 < u < 0.5$); and a europium and manganese-activated silicate phosphor having a composition expressed by General Formula:

$$(Sr_{1-x-y-z-u},Ba_x,Mg_y,Eu_z,Mn_u)_2SiO_4 \quad (3)$$

(where x, y, z, and u are numbers that respectively satisfy $0.1 \leq x \leq 0.35$, $0.025 \leq y \leq 0.105$, $0.025 \leq z \leq 0.025$, and $0.0005 \leq u \leq 0.02$).

The red phosphor of the phosphors constituting the BGR-DR phosphor 8 is made of a europium-activated lanthanum oxysulfide phosphor having a composition expressed by General Formula:

$$(La_{1-x-y},Eu_x,M_y)_2O_2S \quad (4)$$

(where M is at least one element selected from Sb, Sm, Ga, and Sn, and x and y are numbers that respectively satisfy $0.01 < x < 0.15$ and $0 \leq y < 0.03$).

The deep red phosphor of the phosphors constituting the BGR-DR phosphor 8 is made of a manganese-activated magnesium fluorogermanate phosphor having a composition expressed by General Formula:

$$\alpha MgO \cdot \beta MgF_2 \cdot \beta MgF_2 \cdot (Ge_{1-x}Mn_x)O_2 \quad (5)$$

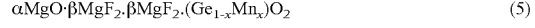

(where α, β, and x are numbers that respectively satisfy $3.0 \leq \alpha \leq 4.0$, $0.4 \leq \beta \leq 0.6$, and $0.001 \leq x \leq 0.5$).

In the case where the coefficients α and β in the manganese-activated magnesium fluorogermanate phosphor having the composition of Formula (5) respectively fall within the above-mentioned ranges, improvement effects of the emission luminance and the color rendering properties can be obtained. A content of Mn is set to a range of 0.001 to 0.5 in terms of a value of x in Formula (5). If the value of x is less than 0.001, an intensification effect of the red light emitting components cannot be sufficiently obtained. If the value of x exceeds 0.5, a decrease in the green light emitting components of 535 to 570 nm becomes problematic, even allowing for an increase effect of the red light emitting components of 600 to 700 nm, and the light emission efficiency decreases as a whole. Accordingly, it is more preferable to set the value of x to a range of 0.002 to 0.2.

Figure 3:
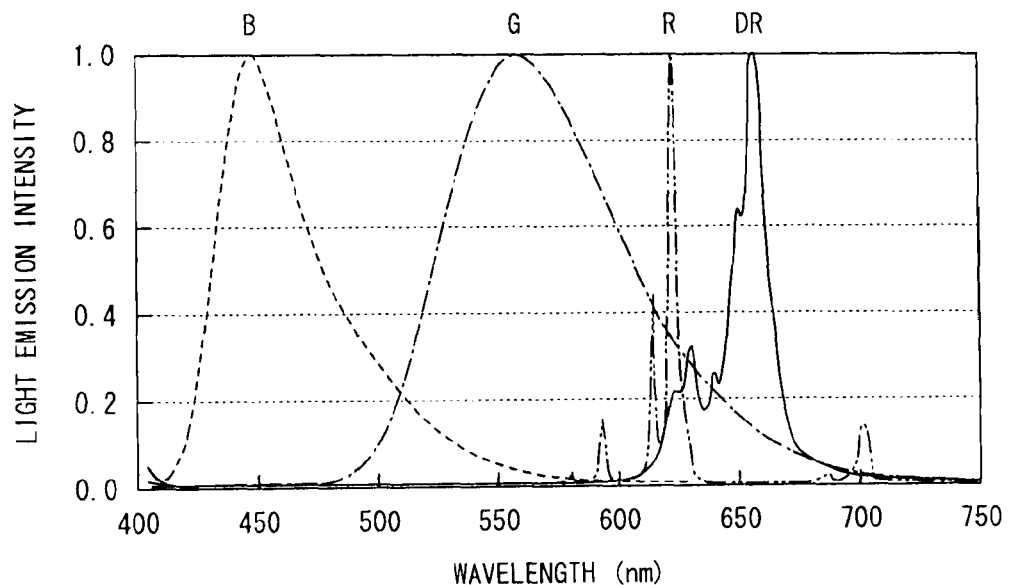
FIG. 3 is a graph showing example emission spectra of four types of B, G, R, and DR phosphors applied to the present invention.

FIG. 3 is a graph showing: an emission spectrum (B) of the Eu-activated alkaline-earth chlorophosphate phosphor $((Sr_{0.95}, Ba_{0.043}, Eu_{0.007})_5(PO_4)_3Cl)$; an emission spectrum (G) of the europium and manganese-activated silicate phosphor $(Sr_{1.48}, Ba_{0.32}, Mg_{0.95}, Eu_{0.1}, Mn_{0.005})SiO_4$; an emission spectrum (R) of the europium-activated lanthanum oxysulfide phosphor $(La_{0.885}, Eu_{0.115})_2O_2S$; and an emission spectrum (DR) of the manganese-activated magnesium fluorogermanate phosphor $(3.5MgO \cdot 0.5MgF_2 \cdot (Ge_{0.99}Mn_{0.01})O_2$, in comparison with one another.

As is apparent from FIG. 3, the manganese-activated magnesium fluorogermanate phosphor (DR) has a main emission peak in a longer wavelength region than a main emission peak of the conventional red phosphor (R), and the light emission intensity between 630 nm and 670 nm is increased, leading to enhancement in red tinge. As a result, the red light emitting components can be intensified.

The red phosphor is known to be inferior to the blue phosphor and the green phosphor in the light emission efficiency for ultraviolet light or violet light having a wavelength in a range of 370 to 430 nm. To address such a problem, the deep red light emitting components are intensified by the manganese-activated magnesium fluorogermanate phosphor (DR), and this enables enhancement in the luminance and color rendering properties of the white light obtained by mixing the colors from the blue, green, and red light emitting components with one another. That is, insufficient light emission of the red phosphor is intensified with the combination use of the conventional red light emitting phosphor and the manganese-activated magnesium fluorogermanate phosphor (DR), and the luminance balance is thus enhanced, leading to enhancement in the luminance of the white light. Further, such enhancement in the luminance balance leads to enhancement in the color rendering properties of the white light.

In the green phosphor having the composition expressed by Formula (3), the light emission of Mn is added to the emission spectrum of the Eu-activated alkaline-earth silicate phosphor, whereby the red light emitting components are considered to be intensified. In order to obtain such an effect, a content of Mn is set to a range of 0.0005 to 0.02 in terms of a value of u in Formula (3). If the value of u is less than 0.0005, an intensification effect of the red light emitting components cannot be sufficiently obtained. If the value of u exceeds 0.02, a decrease in the green light emitting components of 535 to 570 nm becomes problematic, even allowing for an increase effect of the red light emitting components of 600 to 700 nm. It is more preferable to set the value of u to a range of 0.005 to 0.02.

Eu is an activator for obtaining mainly green light emission. In order to obtain the green light emission, a content of Eu is set to a range of 0.025 to 0.25 in terms of a value of z in Formula (3). If the content of Eu falls out of the above-mentioned range, the intensity and the like of the green light emitting components decrease. It is more preferable to set the content of Eu to a range of 0.05 to 0.2 in terms of the value of z.

The intensification effect of the red light emitting components produced by the Eu and Mn-activated alkaline-earth silicate phosphor is remarkable particularly in the case where the phosphor is excited by ultraviolet light or violet light having a peak wavelength in a range of 370 to 430 nm. Note that the red components of the emission spectrum are slightly enhanced even in the case where the Eu and Mn-activated alkaline-earth silicate phosphor is excited by blue light (light emitted from a blue LED) having a peak wavelength of 440 to 470 nm. The Eu and Mn-activated alkaline-earth silicate phosphor having the composition expressed by Formula (3) is suitable particularly for the green phosphor of the white LED lamp 1 including, as the excitation source, the LED chip 2 having a peak wavelength in a range of 370 to 430 nm.

Meanwhile, simple addition of Mn to a conventional Eu-activated alkaline-earth silicate phosphor $((Sr, Ba, Eu)_2SiO_4$ phosphor) does not suffice to obtain excellent light emission characteristics, because the phosphor blackens during preparation thereof. In order to prevent such blackening, in the green phosphor of the present embodiment, Mg is further added to the Eu and Mn-activated alkaline-earth silicate phosphor $((Sr, Ba, Eu, Mn)_2SiO_4$ phosphor).

The addition of Mg to the $(Sr, Ba, Eu, Mn)_2SiO_4$ phosphor enables maintaining light emission characteristics as the green phosphor. In order to obtain the above-mentioned blackening prevention effect, a content of Mg is set to a range of 0.025 to 0.105 in terms of a value of y in Formula (3). If the value of y is less than 0.025, the blackening prevention effect for the green phosphor cannot be sufficiently obtained. If the value of y exceeds 0.105, the green light emitting components of 535 to 570 nm decrease. It is more preferable to set the value of y to a range of 0.075 to 0.105.

In the case of using the Eu and Mn-activated alkaline-earth silicate phosphor as the green phosphor, a content of Ba is set to a range of 0.1 to 0.35 in terms of a value of x in Formula (3). If the content of Ba falls out of the above-mentioned range, a crystal structure and the like of the alkaline-earth silicate change, so that the alkaline-earth silicate becomes a phosphor tinged with green. It is more preferable to set the value of x to a range of 0.1 to 0.3.

The blue phosphor and the red phosphor of the phosphors constituting the BGR-DR phosphor 8 may be various phosphors as long as the used phosphors efficiently absorb the light emitted from the LED chip 2 (particularly, the ultraviolet light or the violet light). In particular, in consideration of the combination with the green phosphor made of the Eu and Mn-activated alkaline-earth silicate phosphor, it is preferable that the blue phosphor be made of at least one selected from a Eu-activated alkaline-earth chlorophosphate phosphor and a Eu-activated aluminate phosphor, and it is preferable that the red phosphor be made of a Eu-activated lanthanum oxysulfide phosphor.

It is preferable that the Eu-activated alkaline-earth chlorophosphate phosphor as the blue phosphor have a composition expressed by General Formula:

$$(Sr_{1-x-y-z}, Ba_x, Ca_y, Eu_z)_6(PO_4)_3Cl \tag{1}$$

(where x, y, and z are numbers that respectively satisfy $0 \leq x < 0.5$, $0 \leq y \leq 0.1$, and $0.005 \leq z < 0.1$).

The Eu-activated alkaline-earth chlorophosphate phosphor that satisfies the composition of Formula (1) has high absorption efficiency of the light emitted from the LED chip 2, and can be excellently combined with the green phosphor expressed by each of Formulae (2) and (3).

It is preferable that the Eu-activated aluminate phosphor have a composition expressed by General Formula:

$$(Ba_{1-x-y-z},Sr_x,Ca_y,Eu_z)(Mg_{1-u}Mn_u)Al_{10}O_{17} \quad (2)$$

(where x, y, z, and u are numbers that respectively satisfy $0 \leq x < 0.2$, $0 \leq y \leq 0.1$, $0.005 < z < 0.5$, and $0.1 < u < 0.5$).
The Eu-activated aluminate phosphor that satisfies the composition of Formula (2) has high absorption efficiency of the light emitted from the LED chip 2 and is excellent.

In addition, another used green phosphor is a europium and manganese-activated silicate phosphor having a composition expressed by General Formula:

$$(Sr_{1-x-y-z-u},Ba_x,Mg_y,Eu_z,Mn_u)_2SiO_4 \quad (3)$$

(where x, y, z, and u are numbers that respectively satisfy $0.1 \leq x \leq 0.35$, $0.025 \leq y \leq 0.105$, $0.025 \leq z \leq 0.25$, and $0.0005 \leq u \leq 0.02$).

It is preferable that the Eu-activated lanthanum oxysulfide phosphor as the red phosphor have a composition expressed by General Formula:

$$(La_{1-x-y},Eu_x,M_y)_2O_2S \quad (4)$$

(where M is at least one element selected from Sb, Sm, Ga, and Sn, and x and y are numbers that respectively satisfy $0.1 < x < 0.15$ and $0 \leq y < 0.03$).
The Eu-activated lanthanum oxysulfide phosphor that satisfies the composition of Formula (4) has high absorption efficiency of the light emitted from the LED chip 2, and can be excellently combined with the green phosphor expressed by each of Formulae (2) and (3).

It is preferable that the manganese-activated magnesium fluorogermanate phosphor as the deep red phosphor have a composition expressed by General Formula:

$$\alpha MgO \cdot \beta MgF_2 \cdot (Ge_{1-x}Mn_x)O_2 \quad (5)$$

(where α, β, and x are numbers that respectively satisfy $3.0 \leq \alpha \leq 4.0$, $0.4 \leq \beta \leq 0.6$, and $0.001 \leq x \leq 0.5$).
The manganese-activated magnesium fluorogermanate phosphor that satisfies the composition of Formula (5) has the main emission peak in a longer wavelength region than the main emission peak of the red phosphor (R), and the light emission intensity between 630 nm to 670 nm is increased, leading to enhancement in red tinge. As a result, the red light emitting components can be intensified, and the color rendering properties can be effectively improved.

Figure 4:
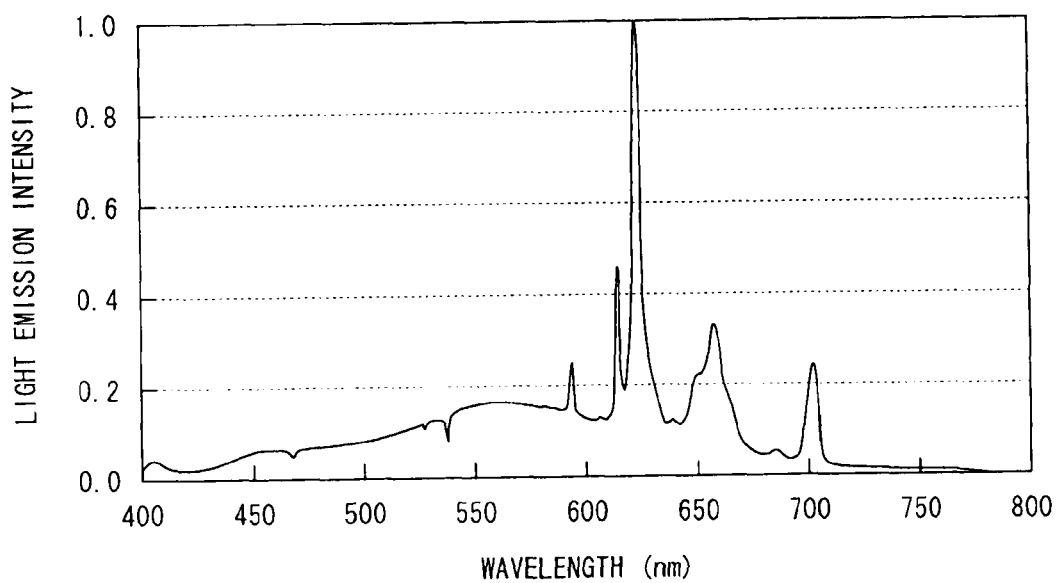
FIG. 4 is a graph showing an example emission spectrum of a white LED lamp according to the embodiment of the present invention.

FIG. 4 shows an example emission spectrum of the white LED lamp 1 containing the BGR-DR phosphor 8 containing the blue (B), green (G), red (R), and deep red (DR) phosphors described above. FIG. 4 shows the emission spectrum obtained when the ultraviolet light from the LED chip having a current value of 20 mA and a peak value of 400 nm is converted by the BGR-DR phosphor into white light having an (x, y) chromaticity value (x=0.300 to 0.350, y=0.300 to 0.350). The following characteristic values can be obtained by the combination of the phosphors described above. A peak value of the blue light emitting components is 450 nm, a peak value of the green light emitting components is 560 nm, a peak value of the red light emitting components is 623 nm, and a peak value of the deep red light emitting components is 650 nm. The luminance is equal to or more than 370 mcd, and the average color rendering index (Ra) is equal to or more than 98.

Figure 5:
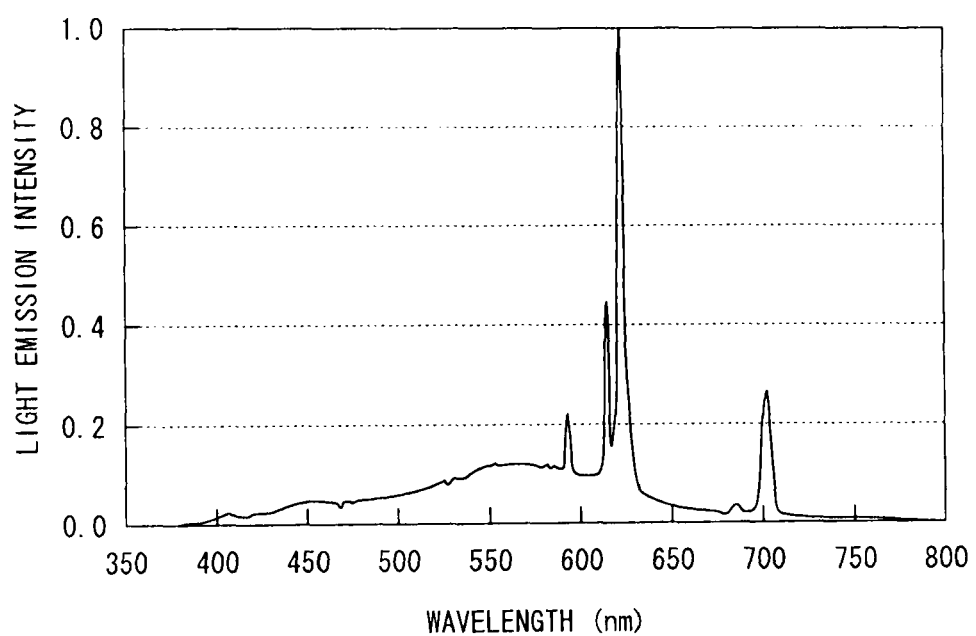
FIG. 5 is a graph showing an example emission spectrum of a white LED lamp including a light emitting portion that is formed using only a conventional BGR phosphor without using a DR phosphor.

In contrast, FIG. 5 shows an example emission spectrum of the white LED lamp 1 containing only the blue (B), green (G), and red (R) phosphors and not containing the deep red (DR) phosphor. Without the deep red (DR) phosphor, it is confirmed that the light emission intensity (light emission efficiency) decreases and that the average color rendering index (Ra) is approximately 92.

The blue, green, red, and deep red phosphors are dispersed into the transparent resin layer 7 in the form of, for example, a mixture. A mixing ratio of the phosphors is appropriately set in accordance with chromaticity of required white light. A phosphor other than the blue, green, red, and deep red phosphors may be added as needed. In order to obtain high-quality white light emission from the light emitting portion 9, it is preferable to set the mixing ratio of the phosphors such that the ratio of the blue phosphor is 20 to 35 percent by mass, the ratio of the green phosphor is 1 to 10 percent by mass, the ratio of the red phosphor is 0.4 to 70 percent by mass, and the ratio of the deep red phosphor is 3 to 25 percent by mass (the total ratio of the blue phosphor, the green phosphor, the red phosphor, and the deep red phosphor is 100 percent by mass).

Further, it is preferable that the blue, green, red, and deep red phosphors each have an average particle diameter in a range of 10 μm or more and 80 μm or less. The average particle diameter in this case refers to a median (50% value) in particle size distribution. The absorption efficiency of the ultraviolet light or the violet light emitted from the LED chip 2 can be enhanced by setting the average particle diameter of each of the blue, green, red, and deep red phosphors to a range of 10 to 80 μm. Accordingly, the luminance of the white LED lamp 1 can be further enhanced. It is more preferable to set the average particle diameter of each phosphor to a range of 20 to 70 μm.

In order to enhance uniformity of the dispersion state of the blue, green, red, and deep red phosphors in the transparent resin layer 7, the blue, green, red, and deep red phosphors may be integrated with one another in advance using a binder such as an inorganic binder and an organic binder, and may be dispersed into the transparent resin layer 7 in such an integrated state. Examples of the inorganic binder include micronized alkaline-earth borate, and examples of the organic binder include transparent resins such as an acrylic resin and a silicone resin. Through the integration process using the binder, the phosphors are randomly bound to one another to have a larger particle diameter. As a result, non-uniformity of the dispersion state caused by, for example, a difference in sedimentation rate among the phosphors in the transparent resin layer 7 can be resolved, and hence the reproducibility of the white light and the uniformity of light emission can be enhanced.

The white LED lamp 1 of the present embodiment has excellent lamp characteristics such as luminance characteristics, color rendering properties, and color reproducibility. Accordingly, the white LED lamp 1 is suitably used as light sources of lighting apparatuses such as in-vehicle lamps, signaling equipment, various switches, and general lighting. A lighting apparatus according to the embodiment of the present invention includes one or more white LED lamps 1 as a light source thereof. The white LED lamp(s) 1 are variously arranged for use on a mounting board in accordance with a configuration of the lighting apparatus to which the white LED lamp(s) 1 are applied. The lighting apparatus including the white LED lamp(s) 1 of the present embodiment provides high-quality lighting as an alternative to a conventional fluorescent lamp.

EXAMPLES

Next, specific examples of the present invention and evaluation results thereof are described hereunder.

Examples 1 to 22

Prepared were:

for the blue phosphor (B), a Eu-activated alkaline-earth chlorophosphate $((Sr_{0.95}, Ba_{0.043}, Eu_{0.007})_5(PO_4)_3 \cdot Cl)$ phosphor (hereinafter, abbreviated to "B1" in Table 1) having an average particle diameter of 12 μm;

for the green phosphor (G), a Eu and Mn-activated alkaline-earth silicate $((Sr_{1.48}, Ba_{0.32}, Mg_{0.095}, Eu_{0.1}, Mn_{0.005})_2SiO_4)$ phosphor (hereinafter, abbreviated to "G1" in Table 1) having an average particle diameter of 15 μm;

for another green phosphor, a europium-activated aluminate $((Ba_{0.95}, Eu_{0.05})(Mg_{0.7}Mn_{0.3})Al_{10}O_{17})$ phosphor (hereinafter, abbreviated to "G2" in Table 1) having an average particle diameter of 15 μm;

for the red phosphor (R), a Eu-activated lanthanum oxysulfide $((La_{0.885}, Eu_{0.115})_2O_2S)$ phosphor (hereinafter, abbreviated to "R1" in Table 1) having an average particle diameter of 12 μm; and for the deep red phosphor (DR), manganese-activated magnesium fluorogermanate phosphors each having an average particle diameter of 12 μm and having respective compositions shown in Table 1. The particle diameter of each phosphor was measured by laser diffractometry using a laser diffraction particle size analyzer.

Each phosphor was mixed with a silicone resin at 30 percent by mass, whereby slurry of each phosphor was prepared. The blue phosphor slurry, the green phosphor slurry, the red phosphor slurry, and the deep red phosphor slurry were mixed with one another at each weight ratio (percent by mass) shown in Table 1 such that emission chromaticity of the white LED lamp fell within a range of (x=0.29 to 0.34, y=0.29 to 0.34) and that a color temperature of an electric bulb color was 2,800 K, whereby each mixture phosphor was prepared.

Next, a silicone resin not containing a phosphor was dropped onto the LED chip (emission peak wavelength: 399 nm, size: 300×300 μm) 2 of the white LED lamp 1 having the configuration illustrated in FIG. 2, and the above-mentioned mixture slurry containing the phosphors was further dropped thereon. Then, the silicone resin was cured through heat treatment at 140° C. In this way, the white LED lamp 1 according to each example was prepared. The prepared white LED lamp was subjected to characteristic evaluation to be described later.

Comparative Example 1

Comparative Example 1 is similar to Example 4, except that the manganese-activated magnesium fluorogermanate phosphor as the deep red phosphor was not contained and that the mixing ratio of the B, G, and R phosphors was adjusted as shown in Table 1. The white LED lamp 1 according to such Comparative Example 1 was prepared so as to have a configuration similar to that illustrated in FIG. 2. The prepared white LED lamp 1 was subjected to the characteristic evaluation to be described later.

Comparative Example 2

Comparative Example 2 is similar to Example 4, except that the deep red phosphor was made of a manganese-activated magnesium fluorogermanate phosphor in which a content ratio of Mn to Ge was set to be excessively small. The white LED lamp 1 according to such Comparative Example 2 was prepared so as to have a configuration similar to that illustrated in FIG. 2. The prepared white LED lamp 1 was subjected to the characteristic evaluation to be described later.

Comparative Example 3

Comparative Example 3 is similar to Example 4, except that the deep red phosphor was made of a manganese-activated magnesium fluorogermanate phosphor in which a content ratio of Mn to Ge was set to be excessively large. The white LED lamp 1 according to such Comparative Example 3 was prepared so as to have a configuration similar to that illustrated in FIG. 2. The prepared white LED lamp 1 was subjected to the characteristic evaluation to be described later.

A current of 20 mA was caused to flow through the white LED lamp prepared as described above according to each of Examples 1 to 22 and Comparative Examples 1 to 3, and the white LED lamp was lighted. Then, the luminance (light emission efficiency) and the average color rendering index Ra of each white LED lamp were measured. Note that the average color rendering index Ra was measured in conformity with Japanese industrial Standards (JIS Z 8726-1990: Method of specifying color rendering properties of light sources). In addition, the light emission characteristics (the luminance, the light emission efficiency) of each white LED lamp were measured by using a compact array spectrometer CAS 140 produced by Instrument Systems and an MCPD apparatus produced by Otsuka Electronics Co., Ltd. These measurement results are shown in Table 1 hereunder.

TABLE 1

| Sample No. | Blue Phosphor (B) Composition of Phosphor | Blue Phosphor (B) Mixing Ratio | Green Phosphor (G) Composition of Phosphor | Green Phosphor (G) Mixing Ratio | Red Phosphor (R) Composition of Phosphor | Red Phosphor (R) Mixing Ratio | Deep Red Phosphor (DR) Composition of Phosphor | Deep Red Phosphor (DR) Mixing Ratio | Average Color Rendering Index (Ra) | Light Emission Efficiency (lm/W) |
|---|---|---|---|---|---|---|---|---|---|---|
| Comparative Example 1 | B1 | 36% | G1 | 5% | R1 | 59% | — | 0% | 92 | 50 |
| Comparative Example 2 | B1 | 29% | G1 | 4% | R1 | 47% | $3.5MgO_2 \cdot 0.5MgF_3 \cdot (Ge_{0.9995}Mn_{0.0005})O_2$ | 20% | 93 | 60 |

TABLE 1-continued

| Sample No. | Blue Phosphor (B) Composition of Phosphor | Blue Phosphor (B) Mixing Ratio | Green Phosphor (G) Composition of Phosphor | Green Phosphor (G) Mixing Ratio | Red Phosphor (R) Composition of Phosphor | Red Phosphor (R) Mixing Ratio | Deep Red Phosphor (DR) Composition of Phosphor | Deep Red Phosphor (DR) Mixing Ratio | Average Color Rendering Index (Ra) | Light Emission Efficiency (lm/W) |
|---|---|---|---|---|---|---|---|---|---|---|
| Comparative Example 3 | B1 | 29% | G1 | 4% | R1 | 47% | $3.5MgO_2 \cdot 0.5MgF_3 \cdot (Ge_{0.3}Mn_{0.7})O_2$ | 20% | 93 | 58 |
| Example 1 | B1 | 25% | G1 | 5% | R1 | 64% | $3.5MgO_2 \cdot 0.5MgF_3 \cdot (Ge_{0.99}Mn_{0.01})O_2$ | 5% | 96 | 65 |
| Example 2 | B1 | 27% | G1 | 4% | R1 | 59% | $3.5MgO_2 \cdot 0.5MgF_3 \cdot (Ge_{0.99}Mn_{0.01})O_2$ | 10% | 98 | 64 |
| Example 3 | B1 | 28% | G1 | 4% | R1 | 53% | $3.5MgO_2 \cdot 0.5MgF_3 \cdot (Ge_{0.99}Mn_{0.01})O_2$ | 15% | 97 | 63 |
| Example 4 | B1 | 29% | G1 | 4% | R1 | 47% | $3.5MgO_2 \cdot 0.5MgF_3 \cdot (Ge_{0.99}Mn_{0.01})O_2$ | 20% | 98 | 62 |
| Example 5 | B1 | 23% | G1 | 6% | R1 | 68% | $3.4MgO_2 \cdot 0.45MgF_3 \cdot (Ge_{0.99}Mn_{0.01})O_2$ | 5% | 96 | 67 |
| Example 6 | B1 | 25% | G1 | 4% | R1 | 61% | $3.4MgO_2 \cdot 0.45MgF_3 \cdot (Ge_{0.99}Mn_{0.01})O_2$ | 10% | 95 | 85 |
| Example 7 | B1 | 26% | G1 | 4% | R1 | 56% | $3.4MgO_2 \cdot 0.45MgF_3 \cdot (Ge_{0.99}Mn_{0.01})O_2$ | 15% | 97 | 54 |
| Example 8 | B1 | 27% | G1 | 4% | R1 | 49% | $3.4MgO_2 \cdot 0.45MgF_3 \cdot (Ge_{0.99}Mn_{0.01})O_2$ | 20% | 98 | 63 |
| Example 9 | B1 | 28% | G1 | 4% | R1 | 48% | $3.5MgO_2 \cdot 0.5MgF_3 \cdot (Ge_{0.993}Mn_{0.007})O_2$ | 20% | 98 | 64 |
| Example 10 | B1 | 30% | G1 | 4% | R1 | 46% | $3.5MgO_2 \cdot 0.5MgF_3 \cdot (Ge_{0.98}Mn_{0.02})O_2$ | 20% | 98 | 63 |
| Example 11 | B1 | 31% | G1 | 4% | R1 | 45% | $3.5MgO_2 \cdot 0.5MgF_3 \cdot (Ge_{0.95}Mn_{0.05})O_2$ | 20% | 98 | 63 |
| Example 12 | B1 | 25% | G2 | 6% | R1 | 64% | $3.5MgO_2 \cdot 0.5MgF_3 \cdot (Ge_{0.99}Mn_{0.01})O_2$ | 5% | 96 | 65 |
| Example 13 | B1 | 27% | G2 | 4% | R1 | 59% | $3.5MgO_2 \cdot 0.5MgF_3 \cdot (Ge_{0.99}Mn_{0.01})O_2$ | 10% | 96 | 64 |
| Example 14 | B1 | 28% | G2 | 4% | R1 | 53% | $3.5MgO_2 \cdot 0.5MgF_3 \cdot (Ge_{0.99}Mn_{0.01})O_2$ | 15% | 97 | 63 |
| Example 15 | B1 | 29% | G2 | 4% | R1 | 47% | $3.5MgO_2 \cdot 0.5MgF_3 \cdot (Ge_{0.99}Mn_{0.01})O_2$ | 20% | 98 | 62 |
| Example 16 | B1 | 23% | G2 | 5% | R1 | 86% | $3.4MgO_2 \cdot 0.45MgF_3 \cdot (Ge_{0.99}Mn_{0.01})O_2$ | 5% | 96 | 57 |
| Example 17 | B1 | 25% | G2 | 4% | R1 | 61% | $3.4MgO_2 \cdot 0.45MgF_3 \cdot (Ge_{0.99}Mn_{0.01})O_2$ | 10% | 96 | 65 |
| Example 18 | B1 | 26% | G2 | 4% | R1 | 55% | $3.4MgO_2 \cdot 0.45MgF_3 \cdot (Ge_{0.99}Mn_{0.01})O_2$ | 15% | 97 | 64 |
| Example 19 | B1 | 27% | G2 | 4% | R1 | 49% | $3.4MgO_2 \cdot 0.45MgF_3 \cdot (Ge_{0.99}Mn_{0.01})O_2$ | 20% | 98 | 63 |
| Example 20 | B1 | 28% | G2 | 4% | R1 | 48% | $3.5MgO_2 \cdot 0.5MgF_3 \cdot (Ge_{0.983}Mn_{0.007})O_2$ | 20% | 98 | 64 |
| Example 21 | B1 | 30% | G2 | 4% | R1 | 46% | $3.5MgO_2 \cdot 0.5MgF_3 \cdot (Ge_{0.98}Mn_{0.02})O_2$ | 20% | 98 | 63 |
| Example 22 | B1 | 31% | G2 | 4% | R1 | 45% | $3.5MgO_2 \cdot 0.5MgF_3 \cdot (Ge_{0.95}Mn_{0.05})O_2$ | 20% | 98 | 63 |

B1: Composition $(Sr_{0.05}Ba_{0.043}Eu_{0.007})_5(PO_4)_3Cl$
G1: Composition $(Sr_{1.48}Ba_{0.32}Mg_{0.095}Mn_{0.005}Eu_{0.1})SiO_4$
G2: Composition $(Ba_{0.95}Eu_{0.05}XMg_{0.7}Mn_{0.3})Al_{10}O_{17}$
H1: Composition $(La_{0.0885}Eu_{0.115})_2O_2S$ As is apparent from the results shown in Table 1, with regard to the white LED lamp according to each of Examples 1 to 22, in which the deep red phosphor having a given composition and having the main emission peak in a longer wavelength region than the main emission peak of the red phosphor was further added and both the red phosphor and the deep red phosphor were used together, both the light emission efficiency and the color rendering properties were excellent in comparison with those of Comparative Examples 1 to 3. The average color rendering index Ra of each example was equal to or more than 95 Ra (in the present examples, 96 to 98 Ra), and hence the color rendering properties were considerably improved in comparison with those of each comparative example. In addition, the light emission efficiency of each example was equal to or more than 62 Lm/W, and hence the light emission efficiency was also improved.

In contrast, with regard to the white LED lamp according to Comparative Example 1, which did not contain a manganese-activated magnesium fluorogermanate phosphor and contained only the conventional BGR phosphor, both the light emission efficiency and the color rendering properties decreased in comparison with those of the present examples.

With regard to the white LED lamp according to Comparative Example 2, which contained the deep red phosphor in which the content ratio of Mn to Ge was set to be excessively small, a small improvement effect of the color rendering properties was found, but no improvement effect of the light emission efficiency was obtained.

With regard to the white LED lamp according to Comparative Example 3, which contained the deep red phosphor in which the content ratio of Mn to Ge was set to be excessively large, a small improvement effect of the color rendering properties was found, but the light emission efficiency considerably decreased.

INDUSTRIAL APPLICABILITY

In a white light emitting lamp according to the present invention, a deep red phosphor having a main emission peak in a longer wavelength region than a main emission peak of a red phosphor is further added, and both the red phosphor and the deep red phosphor are used together. Hence, luminance characteristics (light emission efficiency) and color rendering properties can be both enhanced. Such a white light emitting lamp having both the high color rendering properties and the high luminance can be suitably used for lighting and other such purposes.

DESCRIPTION OF SYMBOLS

1 ... white LED lamp, 2 ... LED chip, 3 ... wiring board, 4 ... frame body, 5 ... bonding wire, 6 ... metal wiring layer, 7 ... transparent resin layer, 7A ... first transparent resin layer, 7B ... second transparent resin layer, 8 ... BGR-DR phosphor, 9 ... light emitting portion

The invention claimed is:

1. A white light emitting lamp, comprising:
   a board;
   a semiconductor light emitting element on the board, which emits ultraviolet light or blue light; and
   a light emitting portion comprising a blue phosphor, a green phosphor, and a red phosphor, which are excited by light emitted from the semiconductor light emitting element to respectively emit blue light, green light, and red light, and a deep red phosphor that comprises a manganese-activated magnesium fluorogermanate phosphor of formula (5):

$$\alpha MgO \cdot \beta MgF_2 \cdot \beta MgF_2 \cdot (Ge_{1-x}Mn_x)O_2 \quad (5)$$

wherein α, β, and x are numbers that respectively satisfy $3.0 \leq \alpha \leq 4.0$, $0.4 \leq \beta \leq 0.6$, and $0.001 \leq x \leq 0.5$, said deep red phosphor having a main emission peak in a longer wavelength region than a main emission peak of the red phosphor, wherein the light emitting portion covers a light emitting surface of the semiconductor light emitting element, wherein the lamp emits white light by mixing light emission colors from the blue phosphor, the green phosphor, and the red phosphor, and wherein the average color rendering index Ra of said white light emitting lamp is 96 or more.

2. The lamp of claim 1, wherein the blue phosphor comprises a europium-activated alkaline-earth chlorophosphate phosphor of formula (1):

$$(Sr_{1-x-y-z}, Ba_x, Ca_y, Eu_z)_5(PO_4)_3Cl \quad (1)$$

wherein x, y, and z are numbers that respectively satisfy $0 \leq x < 0.5$, $0 \leq y < 0.1$, and $0.005 \leq z < 0.1$.

3. The lamp of claim 2, wherein the green phosphor comprises a europium and manganese-activated aluminate phosphor of formula (2):

$$(Ba_{1-x-y-z}, Sr_x, Ca_y, Eu_z)(Mg_{1-u}Mn_u)Al_{10}O_{17} \quad (2)$$

wherein x, y, z, and u are numbers that respectively satisfy $0 \leq x < 0.2$, $0 \leq y < 0.1$, $0.005 < z < 0.5$, and $0.1 < u < 0.5$.

4. The lamp of claim 3, wherein the green phosphor comprises a europium and manganese-activated silicate phosphor of formula (3):

$$(Sr_{1-x-y-z-u}, Ba_x, Mg_y, Eu_z, Mn_u)_2SiO_4 \quad (3)$$

wherein x, y, z, and u are numbers that respectively satisfy $0.1 \leq x \leq 0.35$, $0.025 \leq y \leq 0.105$, $0.025 \leq z \leq 0.25$, and $0.0005 \leq u \leq 0.02$.

5. The lamp of claim 2, wherein the green phosphor comprises a europium and manganese-activated silicate phosphor of formula (3):

$$(Sr_{1-x-y-z-u}, Ba_x, Mg_y, Eu_z, Mn_u)_2SiO_4 \quad (3)$$

wherein x, y, z, and u are numbers that respectively satisfy $0.1 \leq x \leq 0.35$, $0.025 \leq y \leq 0.105$, $0.025 \leq z \leq 0.25$, and $0.0005 \leq u \leq 0.02$.

6. The lamp of claim 1, wherein the green phosphor comprises at least one selected from the group consisting of:
a europium and manganese-activated aluminate phosphor of formula (2):

$$(Ba_{1-x-y-z}, Sr_x, Ca_y, Eu_z)(Mg_{1-u}Mn_u)Al_{10}O_{17} \quad (2)$$

wherein x, y, z, and u are numbers that respectively satisfy $0 \leq x < 0.2$, $0 \leq y < 0.1$, $0.005 < z < 0.5$, and $0.1 < u < 0.5$; and
a europium and manganese-activated silicate of formula (3):

$$(Sr_{1-x-y-z-u}, Ba_x, Mg_y, Eu_z, Mn_u)_2SiO_4 \quad (3)$$

wherein x, y, z, and u are numbers that respectively satisfy $0.1 \leq x \leq 0.35$, $0.025 \leq y \leq 0.105$, $0.025 \leq z \leq 0.25$, and $0.0005 \leq u \leq 0.02$.

7. The lamp of claim 1, wherein the red light emitting phosphor comprises a europium-activated lanthanum oxysulfide of formula (4):

$$(La_{1-x-y}, Eu_x, M_y)_2O_2S \quad (4)$$

wherein M is at least one element selected from the group consisting of Sb, Sm, Ga, and Sn, and x and y are numbers that respectively satisfy $0.01 < x < 0.15$ and $0 \leq y < 0.03$.

8. The lamp of claim 7, wherein the green phosphor comprises a europium and manganese-activated aluminate phosphor of formula (2):

$$(Ba_{1-x-y-z}, Sr_x, Ca_y, Eu_z)(Mg_{1-u}Mn_u)Al_{10}O_{17} \quad (2)$$

wherein x, y, z, and u are numbers that respectively satisfy $0 \leq x < 0.2$, $0 \leq y < 0.1$, $0.005 < z < 0.5$, and $0.1 < u < 0.5$.

9. The lamp of claim 8, wherein the green phosphor comprises a europium and manganese-activated silicate phosphor of formula (3):

$$(Sr_{1-x-y-z-u}, Ba_x, Mg_y, Eu_z, Mn_u)_2SiO_4 \quad (3)$$

wherein x, y, z, and u are numbers that respectively satisfy $0.1 \leq x \leq 0.35$, $0.025 \leq y \leq 0.105$, $0.025 \leq z \leq 0.25$, and $0.0005 \leq u \leq 0.02$.

10. The lamp of claim 7, wherein the green phosphor comprises a europium and manganese-activated silicate phosphor of formula (3):

$$(Sr_{1-x-y-z-u}, Ba_x, Mg_y, Eu_z, Mn_u)_2SiO_4 \quad (3)$$

wherein x, y, z, and u are numbers that respectively satisfy $0.1 \leq x \leq 0.35$, $0.025 \leq y \leq 0.105$, $0.025 \leq z \leq 0.25$, and $0.0005 \leq u \leq 0.02$.

11. The of claim 1, wherein the deep red phosphor consists of said manganese-activated magnesium fluorogermanate phosphor of formula (5):

$$\alpha MgO \cdot \beta MgF_2 \cdot \beta MgF_2 \cdot (Ge_{1-x}Mn_x)O_2 \quad (5)$$

wherein α, β, and x are numbers that respectively satisfy $3.0 \leq \alpha \leq 4.0$, $0.4 \leq \beta \leq 0.6$, and $0.001 \leq x \leq 0.5$.

12. The lamp of claim 1, wherein the blue phosphor, the green phosphor, the red phosphor, and the deep red phosphor each have an average particle diameter in a range from 10 μm or more and 80 μm or less.

13. The lamp of claim 1, wherein the light emitting portion comprises a transparent resin layer that covers the light emitting surface of the semiconductor light emitting element and comprises the blue phosphor, the green phosphor, the red phosphor, and the deep red phosphor.

14. The lamp of claim 1, wherein the light emitting portion comprises:
a first transparent resin layer that covers the light emitting surface of the semiconductor light emitting element and does not comprises the blue phosphor, the green phosphor, the red phosphor, and the deep red phosphor; and
a second transparent resin layer that covers the first transparent resin layer and comprises the blue phosphor, the green phosphor, the red phosphor, and the deep red phosphor.

15. The lamp of claim 1, wherein the semiconductor light emitting element is a light emitting diode or a laser diode that emits light having a peak wavelength in a range of 370 nm or more and 470 nm or less.

16. The lamp of claim 15, wherein the semiconductor light emitting element is a light emitting diode.

17. The lamp of claim 15, wherein the semiconductor light emitting element is a laser diode.

18. A white LED lighting apparatus, comprising the lamp of claim 1.

19. The lamp of claim 1, wherein the blue phosphor, the green phosphor, the red phosphor, and the deep red phosphor each have an average particle diameter in a range from 20 μm or more and 70 μn or less.

20. The lamp of claim 1, wherein the average color rendering index Ra of said white light emitting lamp is 96-98.

* * * * *